United States Patent
Xu et al.

(10) Patent No.: US 11,387,224 B2
(45) Date of Patent: Jul. 12, 2022

(54) PHASE CHANGE MATERIAL IN SUBSTRATE CAVITY

(71) Applicant: Intel Corporation, Santa Clara, CA (US)

(72) Inventors: Cheng Xu, Chandler, AZ (US); Zhimin Wan, Chandler, AZ (US); Yikang Deng, Chandler, AZ (US); Junnan Zhao, Gilbert, AZ (US); Chong Zhang, Chandler, AZ (US); Chandra Mohan M Jha, Chandler, AZ (US); Ying Wang, Chandler, AZ (US); Kyu-oh Lee, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 762 days.

(21) Appl. No.: 16/158,186

(22) Filed: Oct. 11, 2018

(65) Prior Publication Data

US 2020/0118990 A1 Apr. 16, 2020

(51) Int. Cl.
| | |
|---|---|
| H01L 23/34 | (2006.01) |
| H01L 25/18 | (2006.01) |
| H01L 23/00 | (2006.01) |
| H01L 23/538 | (2006.01) |
| F28D 20/02 | (2006.01) |

(52) U.S. Cl.
CPC ............ H01L 25/18 (2013.01); F28D 20/025 (2013.01); H01L 23/34 (2013.01); H01L 23/5383 (2013.01); H01L 23/5386 (2013.01); H01L 24/17 (2013.01)

(58) Field of Classification Search
CPC . H01L 23/34; H01L 23/5383; H01L 23/5386; H01L 24/17; H01L 15/18; F28D 20/025
USPC .......................................................... 257/712
See application file for complete search history.

(56) References Cited

U.S. PATENT DOCUMENTS

| | | | | |
|---|---|---|---|---|
| 7,485,559 B2 * | 2/2009 | Cho | ....................... | H01L 45/144 438/130 |
| 9,190,338 B2 * | 11/2015 | Park | ..................... | H01L 23/4275 |
| 10,269,682 B2 * | 4/2019 | Hsieh | ...................... | H01L 24/83 |

* cited by examiner

Primary Examiner — Luan C Thai
(74) Attorney, Agent, or Firm — Schwabe, Williamson & Wyatt, P.C.

(57) ABSTRACT

A semiconductor device package structure is provided. The semiconductor device package structure includes a substrate having a cavity, and phase change material within the cavity. In an example, the phase change material has a phase change temperature lower than 120 degree centigrade. A die may be coupled to the substrate. In an example, the semiconductor device package structure includes one or more interconnect structures that are to couple the die to the phase change material within the cavity.

20 Claims, 11 Drawing Sheets

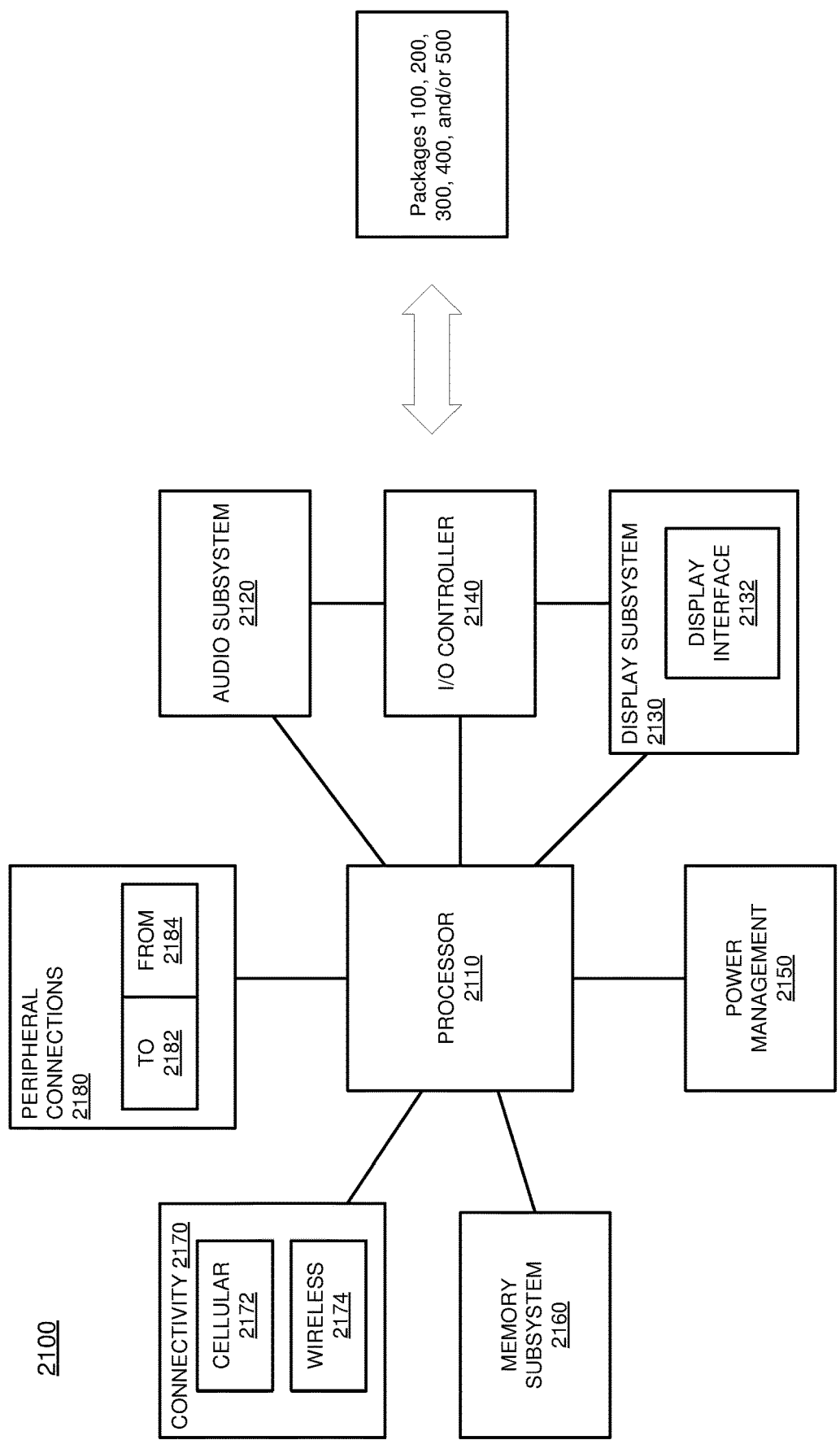

PHASE CHANGE MATERIAL IN SUBSTRATE CAVITY

BACKGROUND

Integrated Circuit (IC) semiconductor device packages are decreasing in size, while becoming more powerful. This has provided a thermal challenge. For example, removing heat from bottom surface of an IC die that is on a substrate can be challenging. In an example, during a high or peak performance period of an IC die (e.g., when an operating frequency and/or operating voltage of the IC die is relatively high, such as in a Turbo mode of operation), higher amount of heat may be generated, possibly leading to an increase in a local temperature of the IC die in a short time period (also referred to as formation of a hotspot in the die). Temperature of such hotspots, if not controlled effectively, may exceed an allowable maximum die temperature.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 9 illustrates a computer system, a computing device or a SoC (System-on-Chip), where one or more components of the computing device are included in a semiconductor package that includes Phase Change Material within one or more cavities of a substrate, e.g., to at least temporarily store heat generated by one or more electrical components of the package, according to some embodiments.

DETAILED DESCRIPTION

Figure 1:
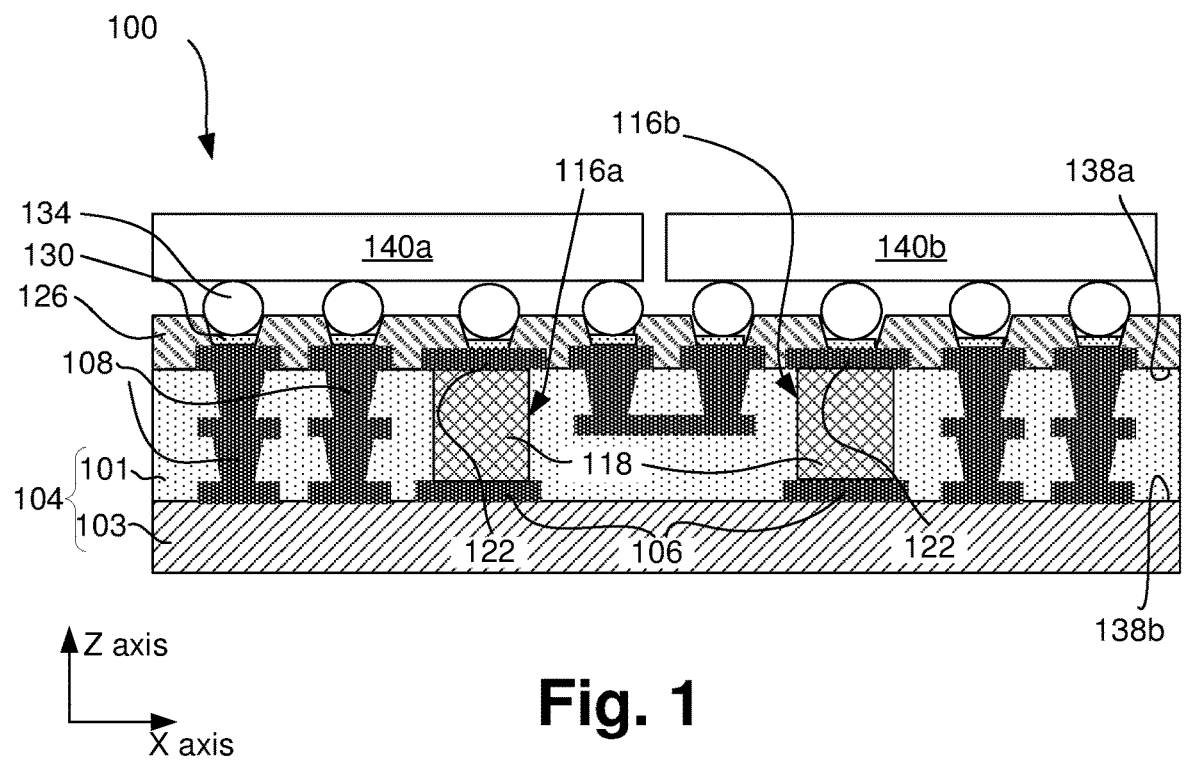
FIG. 1 schematically illustrates a cross-sectional view of a semiconductor package that includes Phase Change Material within one or more cavities of a substrate, e.g., to at least temporarily store heat generated by one or more electrical components of the package, according to some embodiments.

In a semiconductor package, one or more Integrated Circuit (IC) dies may be coupled to a substrate. For example, a first or top surface of a die may be facing away from the substrate, and a second or bottom surface of the die may be facing towards the substrate. It may be a challenge to dissipate heat from the bottom surface of the die (e.g., which is facing the substrate). In some embodiments, to alleviate such thermal issues, the substrate may have embedded Phase Change Material (PCM). For example, the substrate may have cavities filled with the PCM. The cavities filled with the PCM may be thermally coupled to potential hotspots on the bottom surface of the die.

Heat generated by the die may be absorbed by the PCM. For example, when heat is generated by a die (e.g., during a peak load of the die), the heat is transferred to the PCM. When the temperature of the PCM raises to or above a threshold value (also referred to as a phase change temperature), the PCM starts a phase transition from a first phase to a second phase (e.g., between two solid phases, or from a solid phase to a liquid phase, etc.). In the process, the PCM absorbs the generated heat, and maintains the temperature substantially at the phase change temperature (e.g., until all of the PCM has transitioned into the second phase).

When heat generation by the die is relatively low (e.g., during a moderate or low load of the die, or when the die is in a low power or off state) and the temperature drops below the phase change temperature, the PCM releases the heat and transitions back to the first phase. Thus, the PCM oscillates between the two phases, and may constrain the temperature of the hotspots of the IC die to near the phase change temperature. Other technical effects will be evident from the various embodiments and figures.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

It is pointed out that those elements of the figures having the same reference numbers (or names) as the elements of any other figure can operate or function in any manner similar to that described, but are not limited to such.

FIG. 1 schematically illustrates a cross-sectional view (e.g., along X-Z axis) of a semiconductor package 100 (also referred to as package 100) that includes Phase Change Material 118 within one or more cavities of a substrate 104, e.g., to at least temporarily store heat generated by one or more electrical components 140*a*, 140*b* of the package 100, according to some embodiments.

Elements referred to herein with a common reference label followed by a particular number, letter or alphabet may be collectively referred to by the reference label alone. For example, components 140*a*, 140*b* may be collectively and generally referred to as components 140 in plural, and component 140 in singular.

The components 140 can be any electronic device or component that may be included in a semiconductor package, e.g., an Integrated Circuit (IC) die, a chip, a processor, computer memory, platform controller hub, etc. In some embodiments, the component 140 is a discrete chip. The components 140 may include, or be a part of, a processor, memory, or application specific integrated circuit (ASIC), for example. Although merely two components 140 are illustrated, the package 100 may include any other appropriate number of components 140.

The package 100 includes a substrate 104. A substrate discussed herein, such as the substrate 104, may electrically couple an electrical component (e.g., one or more IC dies) and a next-level component to which an IC package (e.g., a circuit board) is coupled. In an example, a substrate may include any suitable type of substrate capable of providing electrical communication between an IC die and an upper IC package coupled with a lower IC/die package. In an example, a substrate may include any suitable type of substrate capable of providing electrical communication between an upper IC package and a next-level component to which an IC package is coupled. A substrate may also provide structural support for a die. By way of example, in one embodiment, a substrate may comprise a multi-layer substrate including alternating layers of a dielectric material and metal built-up around a core layer (either a dielectric core or a metal core). In another embodiment, a substrate may be a coreless multi-layer substrate. Other types of substrates and substrate materials may also be used (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases). In an example, a substrate is a cored or coreless package substrate, may include epoxy resins, FR4, one or more semiconductor interposers (e.g., silicon), etc. A substrate may be formed of any suitable semiconductor material (e.g., a silicon, gallium, indium, germanium, or variations or combinations thereof, among other substrates), one or more insulating layers, such as glass-reinforced epoxy, such as FR-4, polytetrafluoroethylene (Teflon), cotton-paper reinforced epoxy (CEM-3), phenolic-glass (G3), paper-phenolic (FR-1 or FR-2), polyester-glass (CEM-5), ABF (Ajinomoto Build-up Film), any other dielectric material, such as glass, or any combination thereof, such as can be used in printed circuit boards (PCBs).

In some embodiments, the substrate 104 comprises a layer 103 (e.g., which may be a core layer), and one or more layers 101 of dielectric material. The components 140 are attached to the substrate 104 in any suitable configuration, such as a flip-chip configuration. The layers 101 of the substrate 104 includes a first surface 138a and a second surface 138b, and the components 140 are coupled to the surface 138a of the layers 101 of the substrate 104.

The components 140 are coupled to the substrate 104 using interconnect structures 130, 134. The interconnect structures 130, 134, for example, are bumps, bump pads, metal pillars (e.g., copper pillars), balls formed using metals, alloys, solderable material, or the like. For example, the interconnect structures 134 are bumps, balls, and/or solder formed using metals, alloys, solderable material, and/or the like, and the interconnect structures 130 comprises pads (e.g., bump pads) to receive the interconnect structures 130. The interconnect structures 130, 134 are configured to route electrical signals between the components 140 and the substrate 104.

In some embodiments, a layer 126, such as a solder resist material, or mask material, is at least partially over the surface 138a of the layers 101 (e.g., for protection against oxidation and to prevent solder bridges from forming between closely spaced interconnect structures 130).

The substrate 104 includes a plurality of interconnect structures 108. The interconnect structures 108 are interconnect metallization levels embedded within the substrate layers 101. The interconnect structures 108 comprise metals, alloys, solderable material, or the like.

In some embodiments, an individual build-up layer of the layers 101 of the substrate 104 includes an interconnect or metallization level (i.e., a routing layer) for trace routing, and a dielectric layer for electrically insulating laterally adjacent traces as well as adjacent interconnect levels (overlying and/or underlying). The interconnect levels form the interconnect structures 108. Thus, the interconnect structures 108 may include conductive vias, solder, traces, metallization levels, routing layers, etc. The interconnect structures 108 electrically couple the components 140 to the second surface of the layers 101.

Although not illustrated in FIG. 1, the package 100 may include one or more package interconnect structures attached to a bottom surface of the layer 103, e.g., to attach the package 100 to an external component, such as a printed circuit board. In such an example, one or more interconnect structures through the layer 103 may couple the interconnect structures 108 to such package interconnect structures. In another example and although not illustrated in FIG. 1, the layer 103 of the substrate 101 may be removed, and the package interconnect structures may be attached to the bottom surface 138b of the layer 101.

In some embodiments, the substrate 104 (e.g., the layers 101) includes one or more cavities 116a, 116b that are at least partially filled with the PCM 118. The cross-sectional view of FIG. 1 illustrates two such cavities 116, although the package 100 may include any other appropriate number of such cavities.

A cavity 116 has a corresponding top-level metallization layer 122 on a top end of the cavity, and a bottom-level metallization layer 106 on a bottom end of the cavity (e.g., where the metallization layers 106, 122 are formed while forming the interconnect structures 108, as will be discussed herein in further details). The layers 101 form the sidewalls of the cavity 116.

In some embodiments, a cavity 116 is thermally coupled to a corresponding component 140. For example, the cavities 116a, 116b are thermally (and also electrically) coupled to the components 140a, 140b, respectively, by corresponding interconnect structures 130 and 134, and metallization layers 122. For example, the interconnect structures 130, 134 and metallization layers 122 are electrically and thermally conductive, and thermally (and also electrically) couple a cavity 116 to a corresponding component 140.

Exemplary phase change materials have high heat of fusion, which is capable of storing and releasing large amounts of energy. Heat is absorbed or released when the material changes from a first phase to a second phase, and vice versa.

For example, the PCM 118 may be in a first solid phase below a threshold temperature (also referred to as a phase change temperature), and in a second solid phase above the threshold temperature. In another example, the PCM 118 may be in a solid phase below a threshold temperature (also referred to as a phase change temperature), and in a liquid phase above the threshold temperature. In either example, the PCM 118 may be thermally conductive, but may be electrically non-conductive in one or both of the first and second phases.

In some embodiments, the cavities 116 are thermally coupled to one or more hotspots of the components 140. A hotspot may be formed at a bottom surface of a component 140. For example, during an operation of the package 100, the hotspots of a component 140 tend to be at higher temperature than other sections of the component 140. Locations of hotspots may be based on internal layout and/or design of the components 140.

Merely for purposes of explanation, assume that the phase change temperature of the PCM 118 is 75° Centigrade (C), although such assumption does not limit the scope of this disclosure. When a component 140 is at a normal level of operation (e.g., operating at low or moderate frequency and/or low or moderate voltage, such as during a low or moderate load of the component 140) or is non-operational, the temperature of the PCM 118 may be below 75° C., and the PCM may be in a first (e.g., solid) phase.

During operation of the component (e.g., during a high efficiency operation of the component 140, when an operating voltage and/or frequency is relatively high, such as during a peak load of the component 140), heat may be generated by the component 140 (e.g., hotspots may develop on the surface of the component 140). The generated heat may be transmitted to the PCM 118 via the corresponding interconnect structures 130, 134 and metallization layers 122. As the temperature of the PCM 118 increases (and is still below 75° C.), the PCM 118 behaves like sensible heat storage (SHS) material—thus, the PCM 118 absorb heat as the temperature increases. When the temperature of the PCM 118 reaches 75° C. (e.g., the temperature at which the PCM 118 begins to change phase), the PCM 118 may absorb heat while remaining at an almost constant temperature. The PCM 118 continues to absorb heat without a significant rise in temperature beyond 75° C., until all the PCM material in the cavity 116 is transformed from the first (e.g., solid) phase to the second (e.g., solid or liquid) phase. This action may help to regulate the temperature of the hotspots of the component 140.

When the high efficiency operation of the component 140 ceases (e.g., the component 140 becomes non-operational, or a frequency and/or a voltage of the component 140 decreases), the component 140 generates less heat and the hotspot temperature declines. As a result (e.g., when the temperature is at or below the phase change temperature), the PCM 118 may return to the first phase, releasing stored latent heat.

Thus, the PCM 118 may undergo cycles of phase transitions between the first and second phases. When heat is generated by the component 140, the PCM 118 transforms (e.g., from solid to liquid), and absorbs heat. When the component 140 does not generate such heat, the PCM 118 transforms (e.g., from liquid to solid), and releases the heat. The oscillation between the first and second phases may help to ensure that the temperature of the component 140 does not significantly increase, e.g., does not go substantially beyond the phase change temperature of the PCM 118. Thus, the PCM 118 may act as a short-term or temporary thermal storage.

The PCM 118 may include any appropriate solid-liquid (SL) or solid-solid (SS) phase change material. In some examples PCM 118 includes an organic PCM, such as bio-based PCM, paraffin wax ($C_nH_{2n+2}$), and/or carbohydrate and lipid derived PCM. The PCM 118 may include inorganic PCM, such as PCM based on salt hydrates (MnH$_2$O), metal hydrides, etc. The PCM 118 may include inorganic eutectics, hygroscopic materials, etc. The PCM 118 may include polyurethanes, or another SS-PCM material. Any other appropriate type of PCM may be used. In an example, a type of PCM to be selected may be based on an expected operating temperature and/or temperature swing of the components 140, the desired phase change temperature, etc.

In an example, the PCM 118 may have a phase change temperature selected from a range of 50° C. to 100° C. Merely as an example, paraffin wax may have transition temperature up to 100° C. and latent heat of about 261 KJ/Kg. In another example, the PCM 118 may have a phase change temperature selected from a range of 40° C. to 120° C., or from a range of 40° C. to 150° C., or from a range of 40° C. to 200° C. The phase change temperature may be less than a high temperature that the components 140 can safely withstand.

Figure 2:
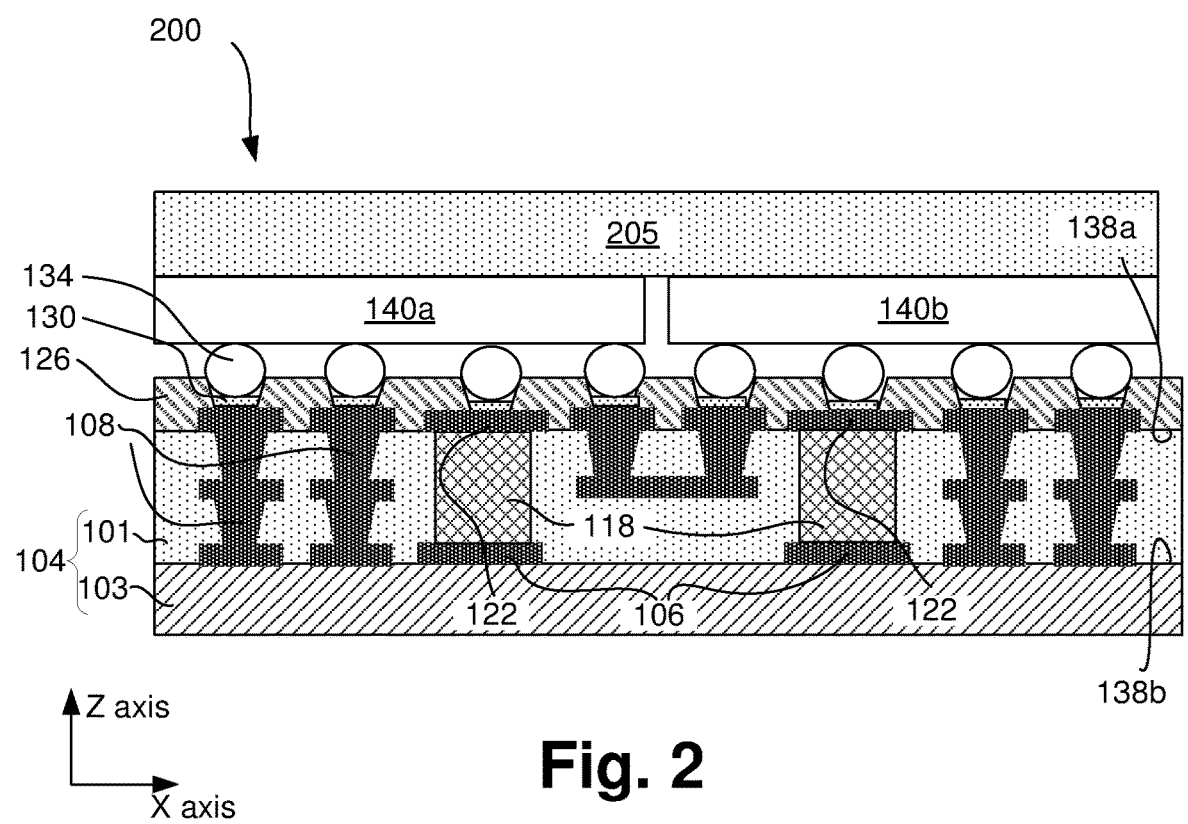
FIG. 2 schematically illustrates a cross-sectional view of a semiconductor package that includes Phase Change Material within one or more cavities of a substrate, e.g., to at least temporarily store heat generated by electrical components of the package, and a heat spreader coupled to the components, according to some embodiments.

FIG. 2 schematically illustrates a cross-sectional view of a semiconductor package 200 (also referred to as package 200) that includes Phase Change Material 118 within one or more cavities of a substrate 104, e.g., to at least temporarily store heat generated by the electrical components 140a, 140b of the package 200, and a heat spreader 205 coupled to the components 140a, 140b, according to some embodiments. The package 200 is at least in part similar to the package 100, and similar components in the packages 100 and 200 are labelled using similar labels. The heat spreader 205 is on top surfaces of the components 140a, 140b. Heat is removed from the top surfaces of the components 140a, 140b by the heat spreader 205, and heat is removed from the bottom surfaces of the components 140a, 140b by the PCM 118.

Figure 3:
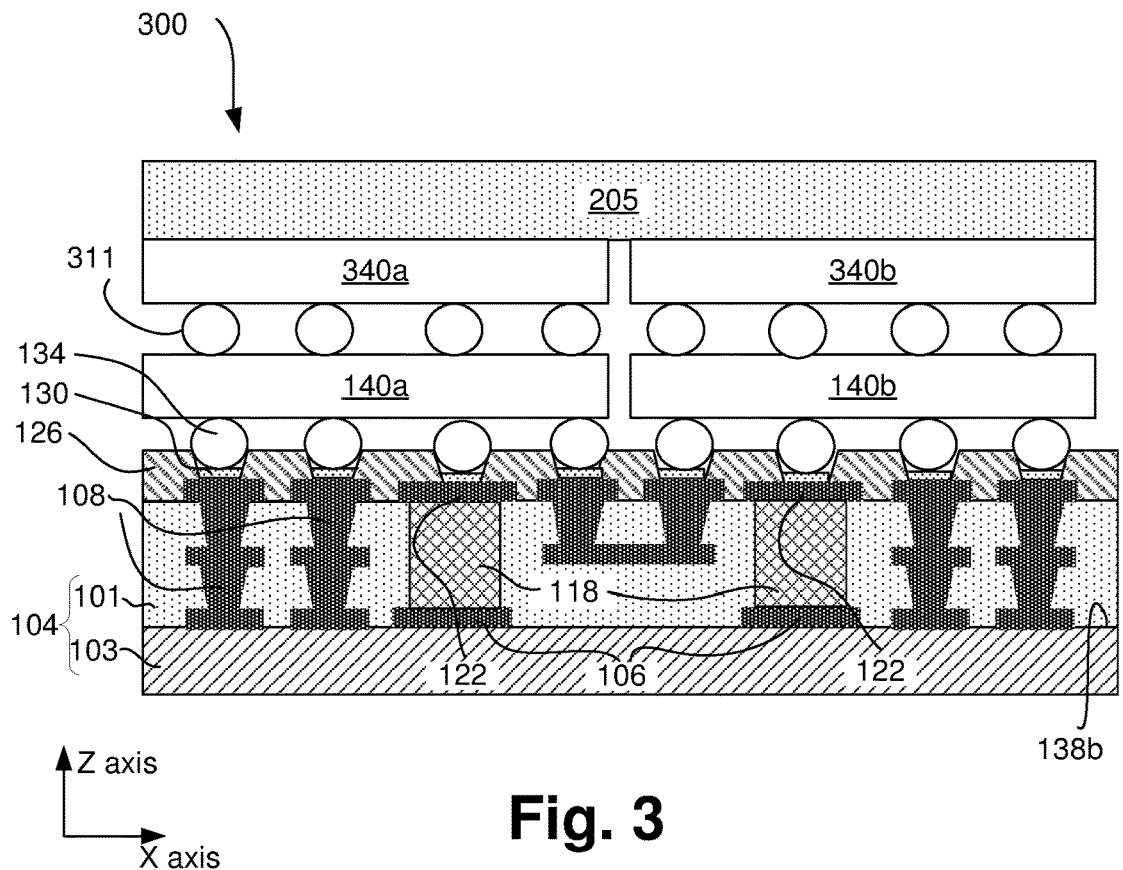
FIG. 3 schematically illustrates a cross-sectional view of a semiconductor package that includes Phase Change Material within one or more cavities of a substrate, e.g., to at least temporarily store heat generated by one or more stacked electrical components of the package, and a heat spreader coupled to the components, according to some embodiments.

FIG. 3 schematically illustrates a cross-sectional view of a semiconductor package 300 (also referred to as package 300) that includes Phase Change Material 118 within one or more cavities of a substrate 104, e.g., to at least temporarily store heat generated by one or more stacked electrical components 340a, 340b, 140a, 140b of the package 300, and a heat spreader 205 coupled to the components 140a, 140b, according to some embodiments. The package 300 is at least in part similar to the packages 100 and 200, and similar components in the packages 100, 200, 300 are labelled using similar labels.

The package 300 further includes components 340a, 340b. The components 340a, 140a are stacked on the substrate 104, and the components 340b, 140b are stacked on the substrate 104. Interconnect components 311 couple the components 340a, 140a, and couple the components 340b, 140b. Although not illustrated in FIG. 3, the components 140 may have one or more through silicon vias to electrically couple the components 340 to the substrate 104. The heat spreader 205 is on top surfaces of the components 340a, 340b. Heat is removed from the components 340a, 340b by the heat spreader 205, and heat is removed from the components 140a, 140b by the PCM 118.

Figure 4A:
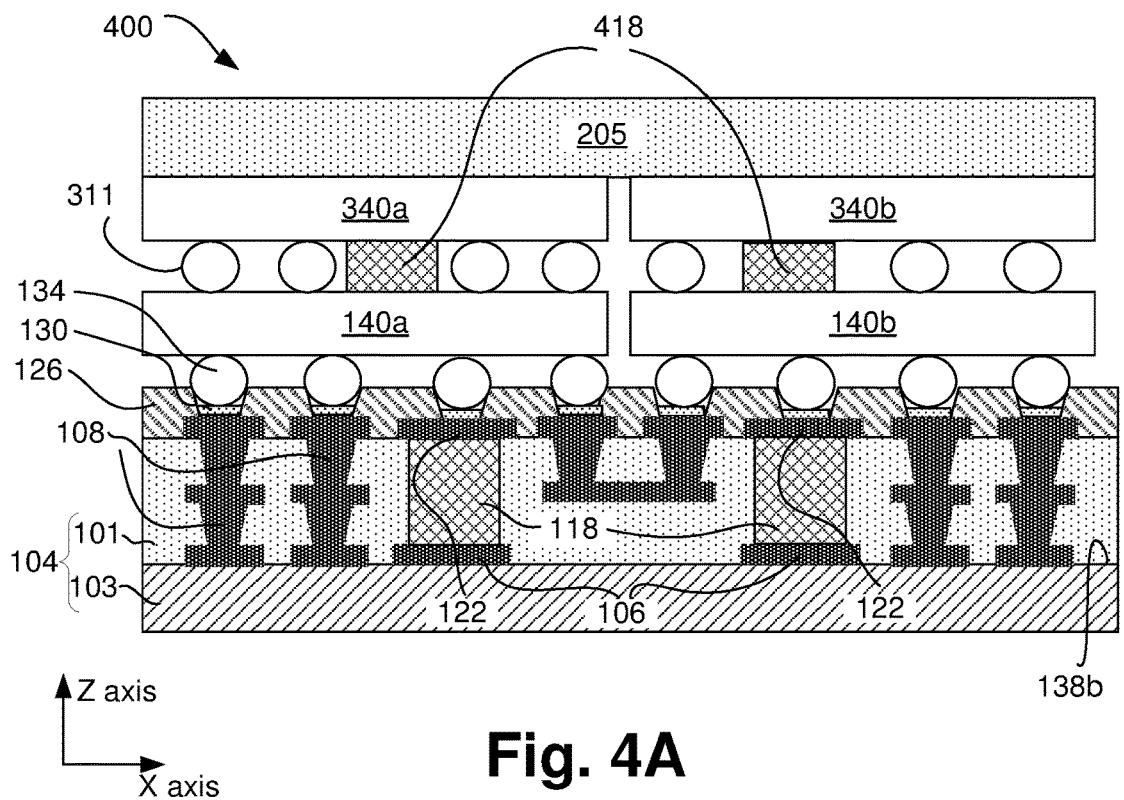
FIG. 4A schematically illustrates a cross-sectional view of a semiconductor package that includes first Phase Change Material within one or more cavities of a substrate, and second Phase Change Material between stacked components of the package, according to some embodiments.

FIG. 4A schematically illustrates a cross-sectional view of a semiconductor package 400 (also referred to as package 400) that includes Phase Change Material 118 within one or more cavities of a substrate 104, and Phase Change Material 418 between components 340 and 140 of the package 400, according to some embodiments. The package 400 is at least in part similar to the package 300, and similar components in these packages are labelled using similar labels.

The package 400 further includes PCM 418 between the components 340 and 140. Heat is removed from the components 340a, 340b by the heat spreader 205 and the PCM 418, and heat is removed from the components 140a, 140b by the PCM 118 and the PCM 418.

Figure 4B:
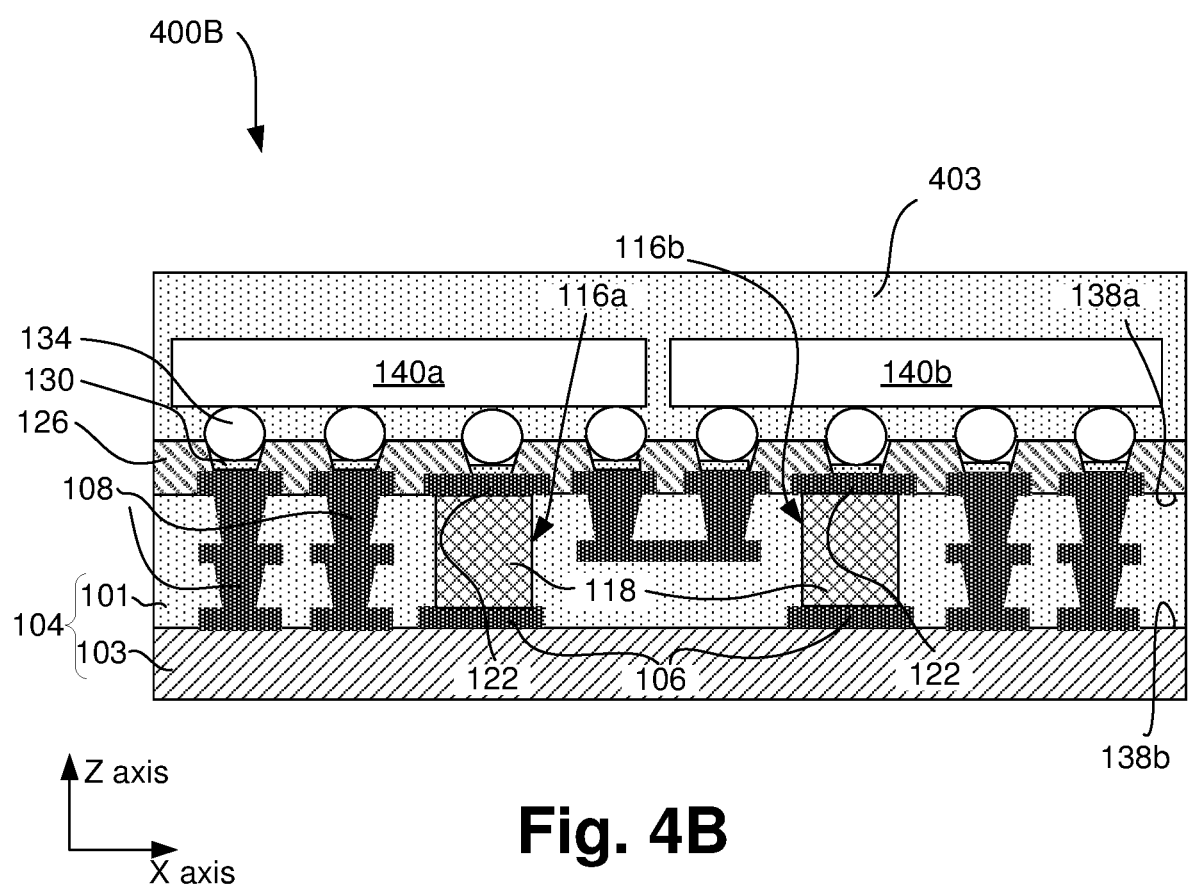
FIG. 4B schematically illustrates a cross-sectional view of a semiconductor package that includes Phase Change Material 118 within one or more cavities of a substrate, where components of the package are at least in part encapsulated by a molding compound, according to some embodiments.

FIG. 4B schematically illustrates a cross-sectional view of a semiconductor package 400B (also referred to as package 400B) that includes Phase Change Material 118 within one or more cavities of a substrate 104, where the components 140 of the package 400B are at least in part encapsulated by a molding compound 403, according to some embodiments. The package 400B is at least in part similar to the package 100 of FIG. 1, and similar components in these packages are labelled using similar labels. In addition to the components of the package 100, the package 400 further includes a molding compound 403 at least in part encapsulating the components 140. Any appropriate molding or encapsulating compound may be used. In an example, heat from the components 140 are removed by the PCM 118.

Figure 5:
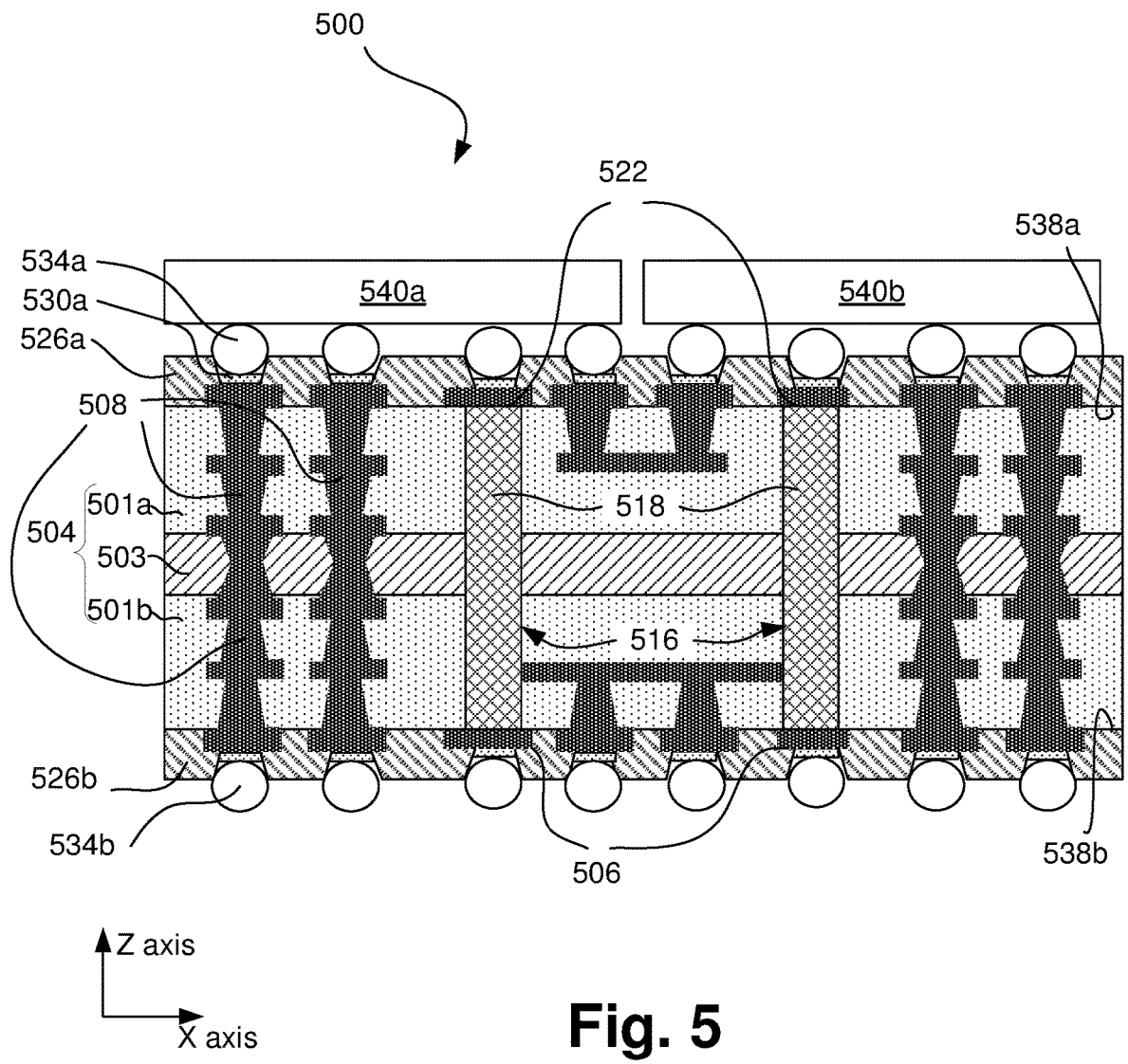
FIG. 5 schematically illustrates a cross-sectional view of a semiconductor package that includes Phase Change Material within one or more cavities of a substrate, e.g., to at least temporarily store heat generated by one or more electrical components of the package, according to some embodiments.

FIG. 5 schematically illustrates a cross-sectional view of a semiconductor package 500 (also referred to as package 500) that includes Phase Change Material 518 within one or more cavities 516 of a substrate 504, e.g., to at least temporarily store heat generated by one or more electrical components 504a, 504b of the package 500, according to some embodiments.

The package 500 is at least in part similar to the package 100 of FIG. 1. For example, the package 500 includes components 540a, 540b, which may be similar to the components 140a, 140b of the package 100. For example, the package 500 includes a substrate 504 (e.g., at least in part similar to the substrate 104), which includes a core layer 503 (e.g., similar to the layer 103 of the package 100) and dielectric layers 501a, 501b (e.g., similar to the layers 101 of the package 100), and various metal interconnect layers. In the package 500 (and unlike the package 100), the dielectric layers 501a and 501b are on two opposing sides of the core layer 503.

The package 500 includes interconnect structures 508, which traverses through the substrate 504. For example, the interconnect structures 508 extend from a first surface 538a of the substrate 504 to a second surface 538b of the substrate 504. The interconnect structures 508 are at least in part similar to the interconnect structures 108 of the package 100.

The components 540a, 540b are coupled to the surface 538a of the substrate 504 by interconnect structures 534a, 530a (e.g., which are respectively similar to the interconnect structures 134a, 130a of the package 100). The interconnect structures 534a, 530a are at least in part protected by a layer 526a that includes solder resist material (e.g., similar to the layer 126 of the package 100).

The surface 538b of the package 500 includes package interconnect structures 534b coupled to respective interconnect structures 508. The package interconnect structures 534b are used to couple the package 500 to an external component (e.g., a printed circuit board).

In some embodiments, the package 500 has cavities 518 through the substrate 504, where the cavities include PCM 518 (e.g., similar to the cavities 116 and PCM 118 of the package 100). The cavities 516 are bounded by top and bottom metallization layers 522 and 506 (e.g., similar to the metallization layers 122 and 106 of the package 100). The top metallization layers 522 and interconnect structures 534a, 530a thermally couple the PCM 118 to the components 540. The PCM 518 operates at least in part similar to the PCM 118 of the package 100, e.g., to control the temperature of the bottom surface of the dies 540.

Although not illustrated in the figures and at least in part similar to FIG. 2, the package 500 may have a heat spreader on top surfaces of the components 540. Although not illustrated in the figures and at least in part similar to FIG. 3, the package 500 may have multiple stacked dies and a heat spreader. Although not illustrated in the figures and at least in part similar to FIG. 4, the package 500 may have multiple stacked dies, a heat spreader, and PCM material between two stacked dies.

FIGS. 6A, 6B, 6C, 6D, 6E, 6F, and 6G illustrate example processes for formation of the semiconductor device package structure (e.g., package 100) of FIG. 1, according to some embodiments. For example, FIGS. 6A-6G are cross-sectional views of the package 100 evolving as example operations for formation of the package 100 are performed.

Figure 6A:
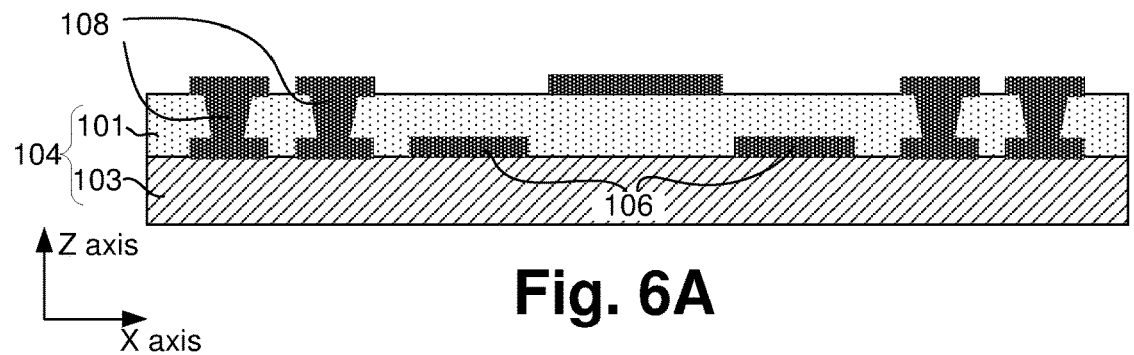
FIGS. 6A, 6B, 6C, 6D, 6E, 6F, and 6G illustrate example processes for formation of the semiconductor device package structure of FIG. 1, according to some embodiments.

Referring to FIG. 6A, a section of the substrate 104 is formed. The substrate 104 includes the layers 103 and 101, and metallization levels 108 embedded within the layers (e.g., the metallization levels 108 are part of the interconnect structures 108 of FIG. 1). The metallization levels 108 include metallization levels 106, which form bottom sections of the cavities 116, as will be discussed herein later.

Figure 6B:
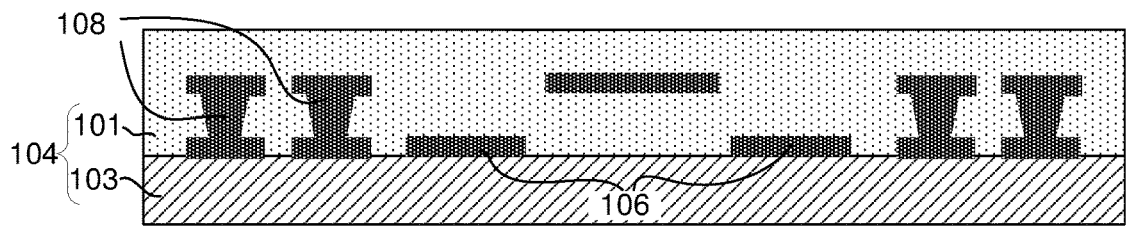

Referring now to FIG. 6B, the substrate 104 is extended by forming built-up layers, e.g., to extend the layer 101. For example, top sections of the layer 101 may be laminated in FIG. 6B.

Figure 6C:
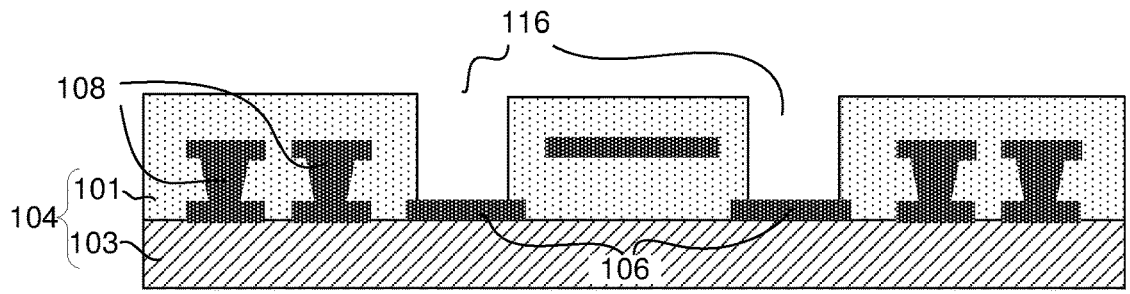

Referring now to FIG. 6C, cavities 116 are formed within the substrate 104. The cavities may be formed using laser drilling, laser skiving, mechanical drilling, and/or the like. As discussed with respect to FIG. 1, the location of the cavities may be selected such that the cavities 116 are underneath corresponding thermal hotspots of the components 140.

A cavity 116 may reach a corresponding metallization level 106, in an example (although in another example, the cavity 116 may not reach the corresponding metallization level 106). In an example, if mechanical drill is employed, a cavity 116 may have substantially constant diameter along the length of the cavity. For example, a diameter at a top section of the cavity 116 may be substantially similar to that at a bottom section of the cavity 116. Merely as an example, mechanical drilling may be applied to make through-hole cavities with drill bit size of, for example, one of 100 microns, 150 microns, 250 microns, 350 microns, or the like, e.g., based on a desired diameter of the cavities.

If laser drilling is employed, the diameter of the cavity 116 may monotonically decrease along the length of the cavity 116, e.g., may monotonically decrease from a top section of the cavity 116 to a bottom section of the cavity 116.

In an example, a diameter of the cavity 116 may be in the range of about 30 microns to about 380 microns, or about 30 microns to about 500 microns. The diameter may depend on a desired amount of PCM to be included in the cavity 116. If higher amount of heat is to be stored in the PCM, the diameter may be made higher to accommodate higher quantity of PCM, and vice versa.

Figure 6D:
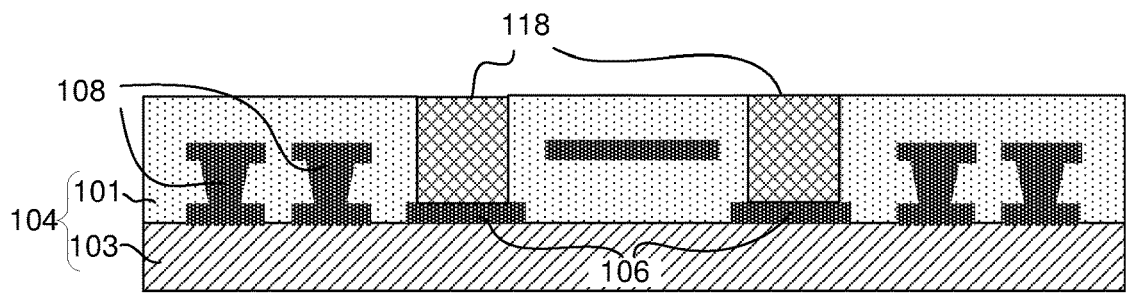

Referring now to FIG. 6D, cavities 116 are filled with the PCM 118. For example, phase change material may be deposited (e.g., printed and/or plugged) within the cavities 116, followed by curing and/or grinding.

Figure 6E:
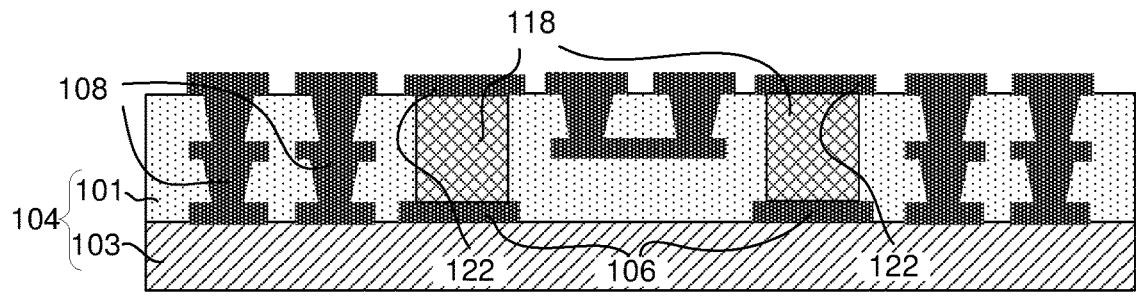
Figure 6F:
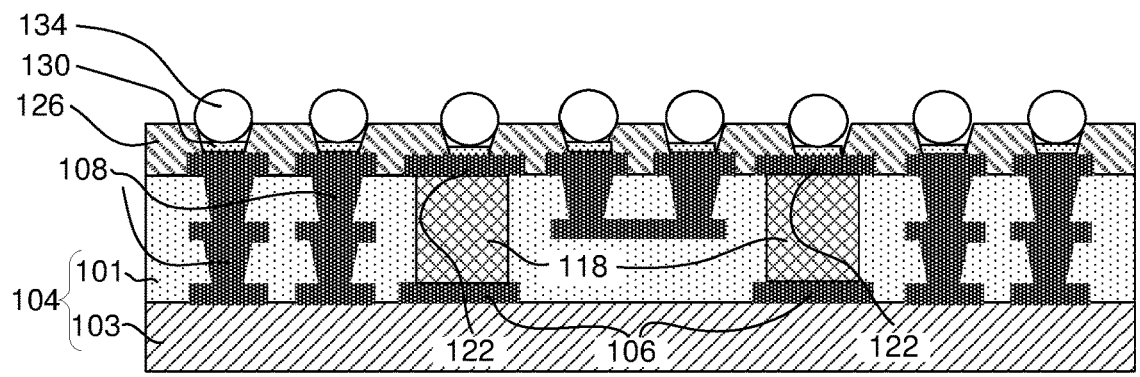
Figure 6G:
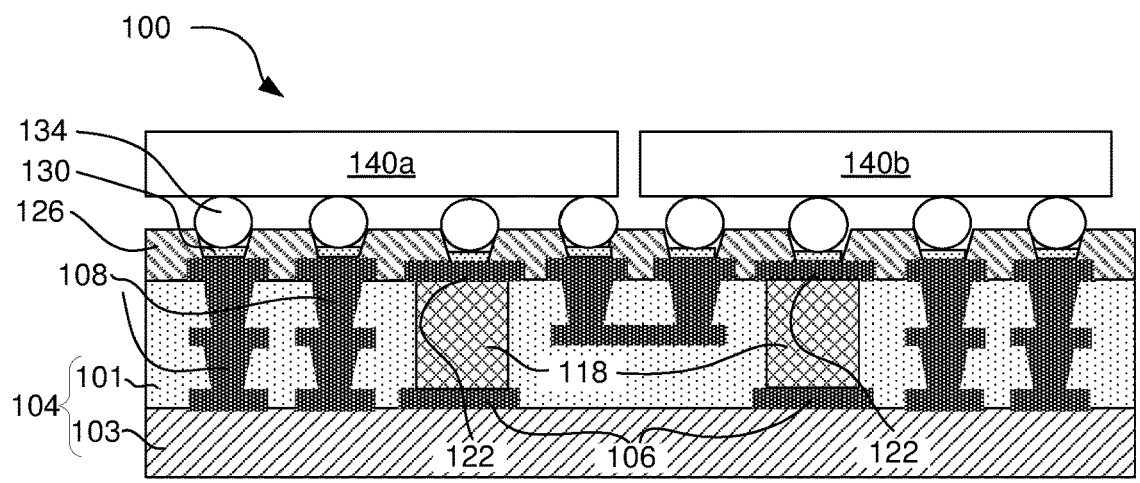

Referring now to FIG. 6E, further metallization levels may be patterned and formed within the substrate layers 101, e.g., to form the interconnect structures 108. Metal layers (e.g., pads) 122 are formed on the PCM 118. Referring now to FIG. 6F, layer 126 comprising solder resist material may be formed, patterned, and interconnect structures 134 may be formed. Referring now to FIG. 6G, the components 140a, 140b may be coupled to the substrate 104, thereby forming the package 100 of FIG. 1.

FIGS. 7A, 7B, 7C, 7D, 7E, and 7F illustrate example processes for formation of the semiconductor device package structure (e.g., package 500) of FIG. 5, according to some embodiments. For example, FIGS. 7A-7F are cross-sectional views of the package 500 evolving as example operations for formation of the package 500 are performed.

Figure 7A:
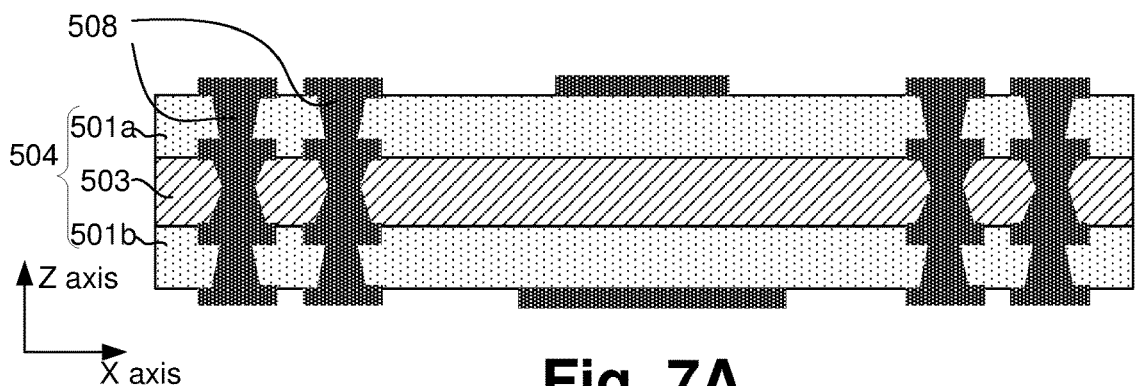
FIGS. 7A, 7B, 7C, 7D, 7E, and 7F illustrate example processes for formation of the semiconductor device package structure of FIG. 5, according to some embodiments.

Referring to FIG. 7A, a section of the substrate 504 is formed. The substrate 504 includes the layer 503 including a core, and layers 501a and 501b including dielectric material on two sides of the layer 503. The substrate 504 also includes metallization levels 508 embedded within the layers (e.g., the metallization levels 508 are part of the interconnect structures 508 of FIG. 5).

Figure 7B:
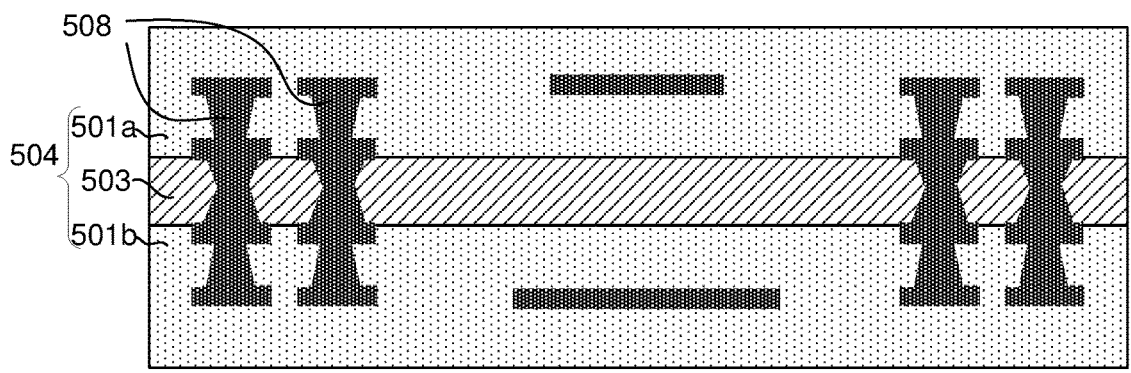

Referring now to FIG. 7B, the substrate 504 is extended by forming built-up layers, e.g., to extend the layers 501a, 501b, on both sides of the layer 503. For example, sections of the layers 501a, 501b may be laminated in FIG. 7B.

Figure 7C:
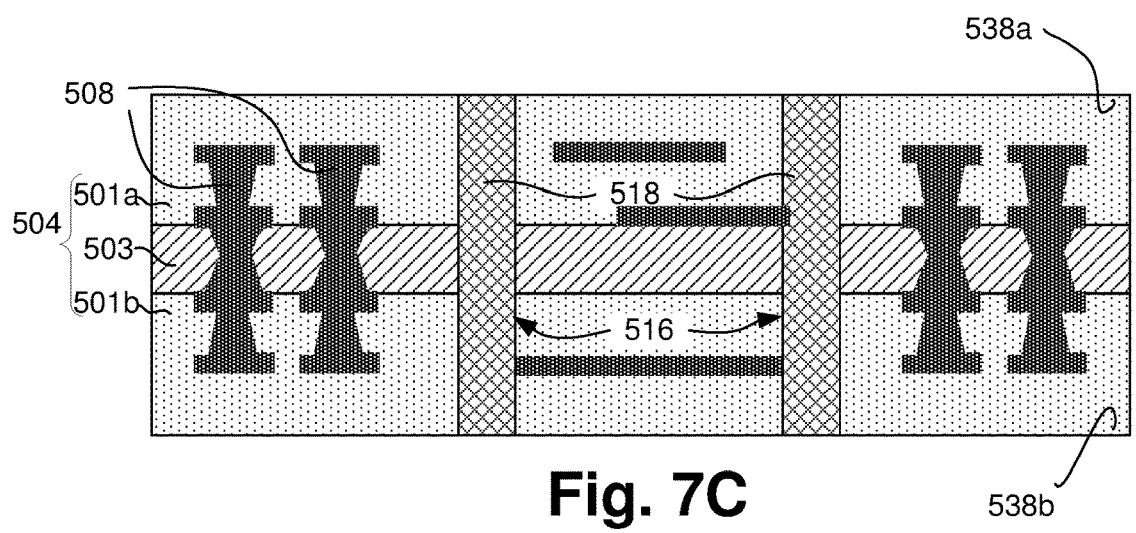

Referring now to FIG. 7C, cavities 516 are formed within the substrate 504, and filled with PCM 518. The cavities 516 may be formed using laser drilling, laser skiving, mechanical drilling, and/or the like. As discussed with respect to FIGS. 1 and 5, the location of the cavities 516 may be selected such that the cavities 516 are underneath corresponding thermal hotspots of the components 540.

The cavities 116 are through holes within the substrate 504, e.g., extending from the surface 538a to the surface 538b of the substrate 504. Thus, the cavity 116 extends through the layers 501a, 503, and 501b.

In an example, if mechanical drill is employed, a cavity 516 may have substantially constant diameter along the length of the cavity. For example, a diameter at a top section of the cavity 516 may be substantially similar to that at a bottom section of the cavity 516. Merely as an example, mechanical drilling may be applied to make through-hole cavities with drill bit size of, for example, one of 100 microns, 150 microns, 250 microns, 350 microns, or the like, e.g., based on a desired diameter of the cavities.

If laser drilling is employed, the diameter of the cavity 516 may monotonically decrease along the length of the cavity 516, e.g., may monotonically decrease from a top section of the cavity 516 (e.g., at the surface 538a) to a bottom section of the cavity 516 (e.g., at the surface 538b).

Also referring to FIG. 7C, cavities 516 are filled with the PCM 518. For example, phase change material may be deposited (e.g., printed or plugged) within the cavities 516, followed by curing and/or grinding.

Figure 7D:
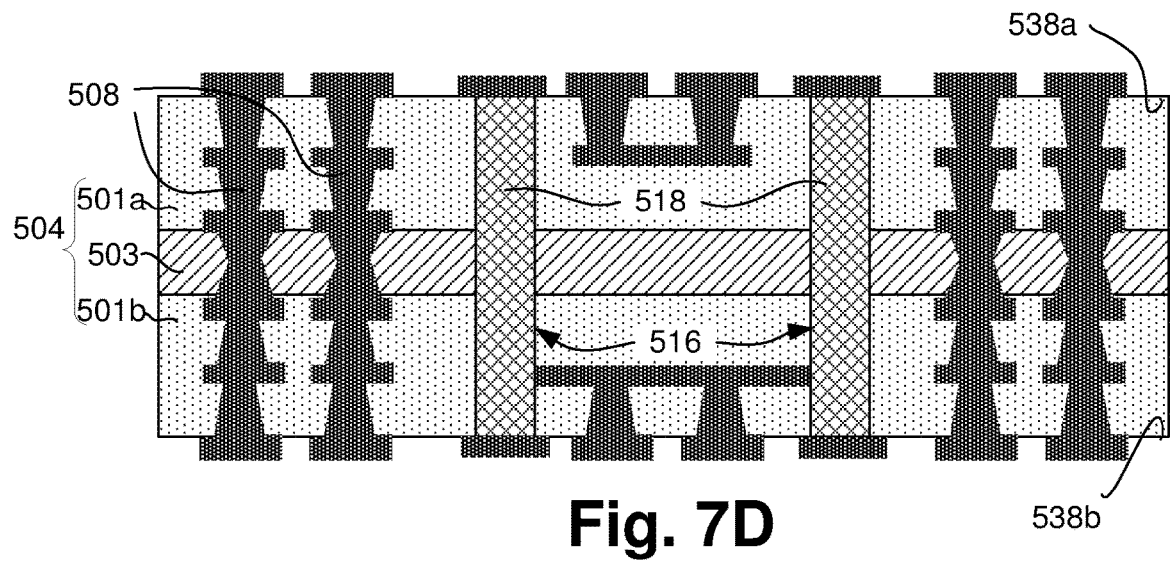

Referring now to FIG. 7D, further metallization levels may be patterned and formed within the substrate layers 501, e.g., to form the interconnect structures 508. Metal layers (e.g., pads) are formed on both ends of the cavities, e.g., covering the PCM 118.

Figure 7E:
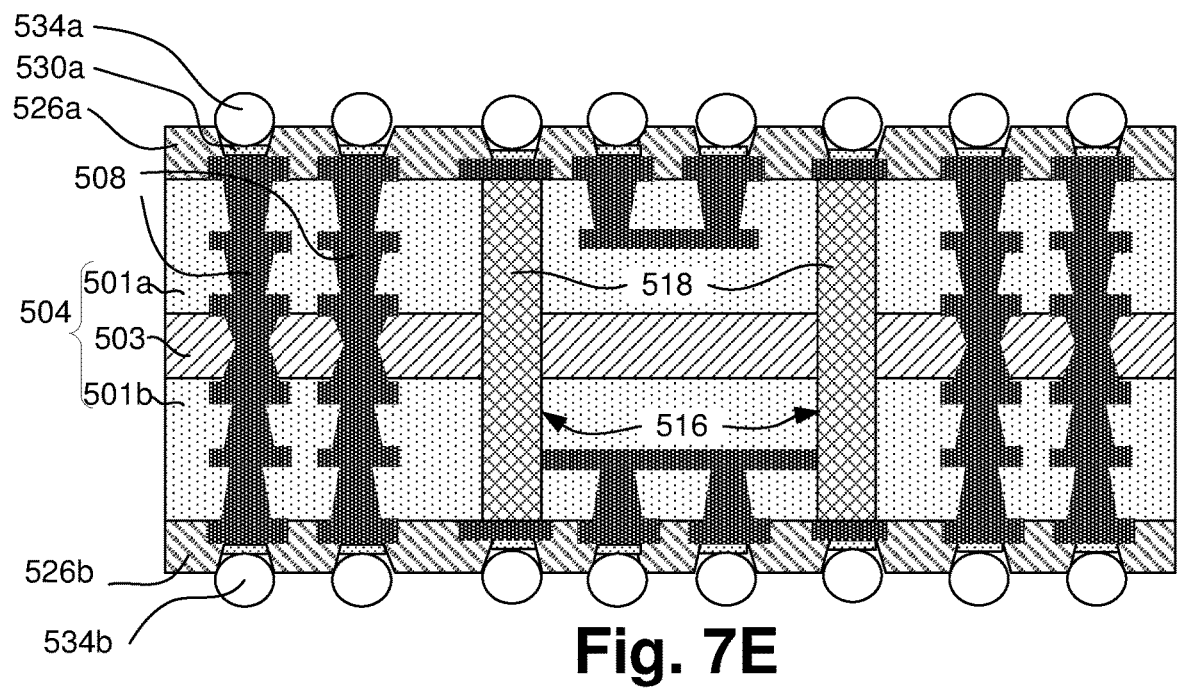
Figure 7F:
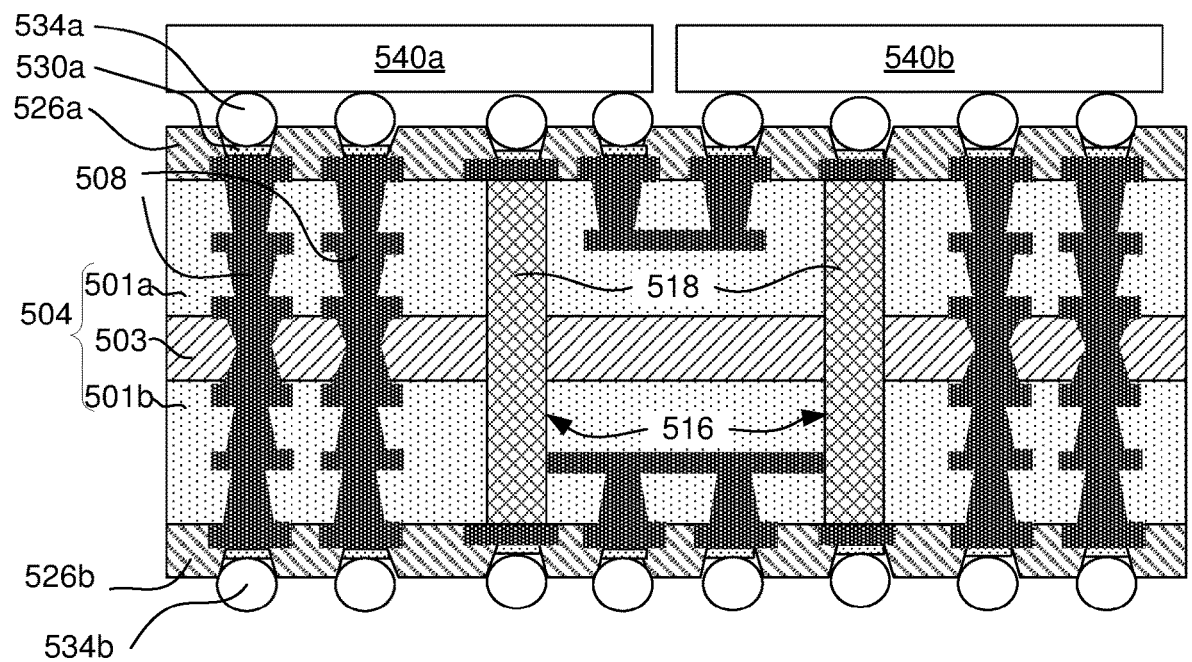

Referring now to FIG. 7E, layer 526a, 526b comprising solder resist material may be formed and patterned on two opposing surfaces 538a, 538b of the substrate 504, and interconnect structures 534a, 534b may be formed. Referring now to FIG. 7F, the components 540a, 540b may be coupled to the substrate 504, thereby forming the package 500 of FIG. 5.

Figure 8:
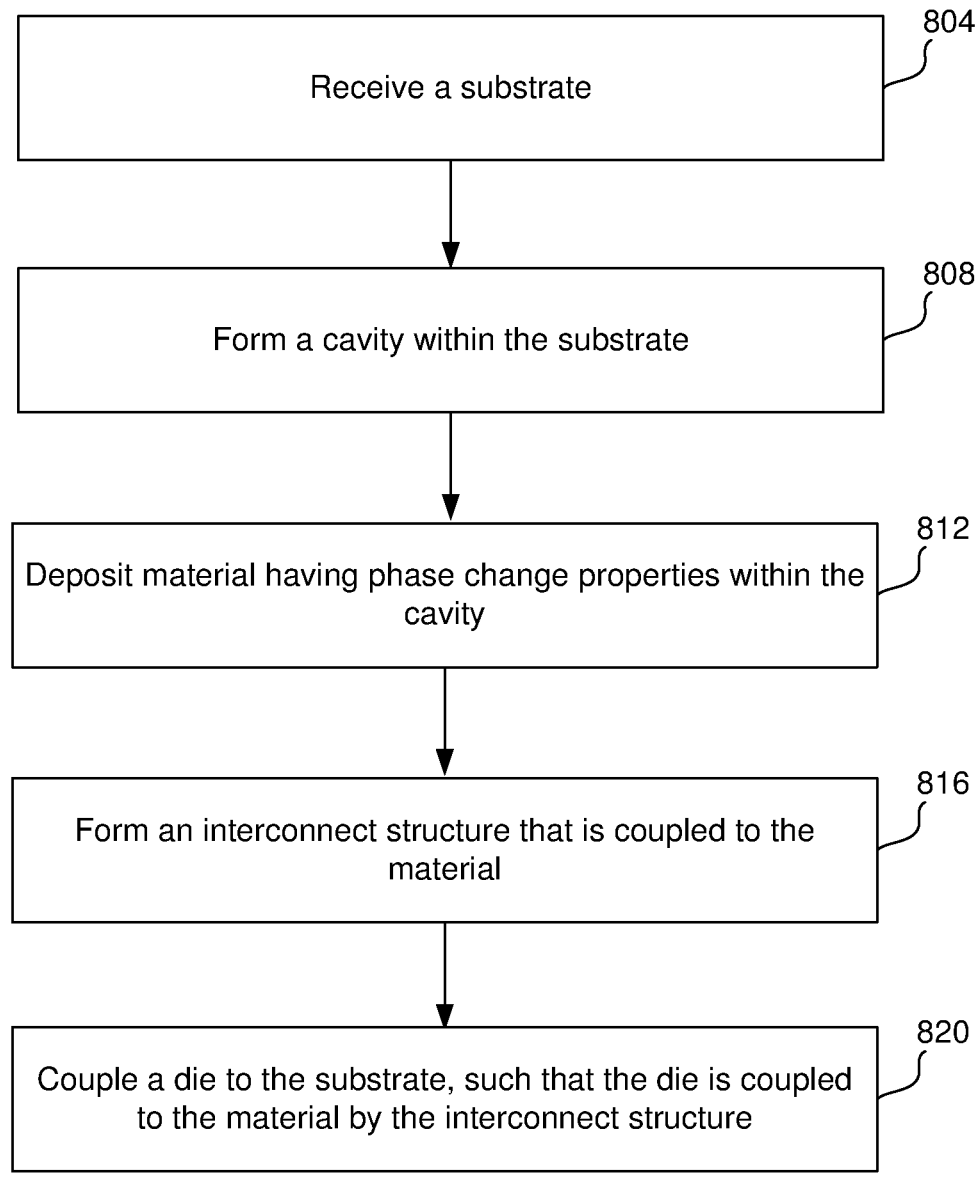
FIG. 8 illustrates a flowchart depicting a method for forming a semiconductor device package structure that includes Phase Change Material within one or more cavities of a substrate, e.g., to at least temporarily store heat generated by one or more electrical components of the package, according to some embodiments.

FIG. 8 illustrates a flowchart depicting a method 800 for forming a semiconductor device package structure (e.g., any of the packages 100, 200, 300, 400, or 500 discussed herein) that includes Phase Change Material within one or more cavities of a substrate, e.g., to at least temporarily store heat generated by one or more electrical components of the package, according to some embodiments. Although the blocks in the flowchart with reference to FIG. 8 are shown in a particular order, the order of the actions can be modified. Thus, the illustrated embodiments can be performed in a different order, and some actions/blocks may be performed in parallel. Some of the blocks and/or operations listed in FIG. 8 may be optional in accordance with certain embodiments. The numbering of the blocks presented is for the sake of clarity and is not intended to prescribe an order of operations in which the various blocks must occur.

The method 800 includes, at 804, receiving a substrate (e.g., substrate 104 of FIG. 6B, or substrate 504 of FIG. 7B). At 808, a cavity is formed within the substrate (e.g., cavity 116, or cavity 516). At 812, material having phase change properties (e.g., PCM 118, 518) are deposited within the cavity. In an example, the material has a phase change temperature less than 120 degree centigrade.

At 816, an interconnect structure is formed (e.g., interconnect structure 134, or interconnect structure 534a). The interconnect structure may be coupled (e.g., thermally coupled) to the material. At 820, a die (e.g., component 140, 540) is coupled to the substrate, such that the die is coupled to the material by the interconnect structure.

FIG. 9 illustrates a computer system, a computing device or a SoC (System-on-Chip) 2100, where one or more components of the computing device 2100 are included in a semiconductor package (e.g., any of the semiconductor packages discussed herein, such as packages 100, 200, 300, 400, or 500) that includes Phase Change Material within one or more cavities of a substrate, e.g., to at least temporarily store heat generated by one or more electrical components of the package, according to some embodiments. It is pointed out that those elements of FIG. 9 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, one or more components of the computing device 2100 may be included in one or more IC dies (e.g., components 140, 540 discussed with respect to FIGS. 1-8). For example, the processor 2110 is included in a first die and a memory of the memory subsystem 2160 is included in a second die. The one or more dies are included in a semiconductor device package (e.g., any of packages 100, 200, 300, 400, or 500 of FIGS. 1-8) of the computing device 2100. The package may include PCM (e.g., PCM 118, 518) within a cavity of a substrate, where the PCM may be thermally coupled to a die, as discussed herein with respect to FIGS. 1-8.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

A semiconductor device package structure comprising: a substrate having a cavity; phase change material within the cavity, the phase change material having a phase change temperature lower than 120 degrees centigrade; a die coupled to the substrate; and one or more interconnect structures to couple the die to the phase change material within the cavity.

Example 2

The semiconductor device package structure of example 1 or any other example, wherein the one or more interconnect structures are electrically floating.

Example 3

The semiconductor device package structure of example 1 or any other example, wherein the one or more interconnect structures are first one or more interconnect structures, and wherein the semiconductor device package structure comprises: second one or more interconnect structures to electrically couple the die to the substrate.

Example 4

The semiconductor device package structure of example 3 or any other example, wherein the first one or more interconnect structures and the second one or more interconnect structures comprises electrically conductive material.

Example 5

The semiconductor device package structure of example 1 or any other example, wherein: the substrate has a first surface facing the die, and a second surface opposite the first surface; and the cavity extends from the first surface to the second surface.

Example 6

The semiconductor device package structure of example 1 or any other example, wherein: the substrate has a first surface facing the die, and a second surface opposite the first surface; the substrate includes one or more core layers and one or more layers comprising dielectric material; the cavity extends from the first surface to the second surface, and traverses through the one or more core layers and the one or more layers comprising dielectric material; and the semiconductor device package structure comprises another one or more interconnect structures coupled to the second surface of the substrate, the another one or more interconnect structures to couple the semiconductor device package structure to a circuit board.

Example 7

The semiconductor device package structure of example 1 or any other example, wherein: the phase change material comprises one or more of: paraffin, metal hydride, or salt hydride.

Example 8

The semiconductor device package structure of example 1 or any other example, wherein the cavity has: a first end coupled to the die by the one or more interconnect structures; and a second end affixed to a layer comprising electrically conductive material.

Example 9

The semiconductor device package structure of example 1 or any other example, wherein: the die has a first surface facing the substrate, and a second surface opposite the first surface; the first surface of the die is coupled to the substrate and to the phase change material; and the semiconductor device package structure comprises a heat spreader coupled to the second surface of the die.

Example 10

The semiconductor device package structure of example 1 or any other example, wherein the die is a first die, and the semiconductor device package structure comprises: a second die, wherein the first and second dies are in a stack over the substrate, with the first die between the substrate and the second die, wherein the phase change material is first phase change material; and a second phase change material between the first die and the second die.

Example 11

The semiconductor device package structure of example 10 or any other example, wherein: a first surface of the second die faces the first die, and a second surface of the second die is opposite the first surface; and the semiconductor device package structure comprises a heat spreader coupled to the second surface of the second die.

Example 12

The semiconductor device package structure of example 1 or any other example, wherein one or more interconnect structures are to thermally couple the die to the Phase Change Material within the cavity.

Example 13

The semiconductor device package structure of example 1 or any other example, wherein a width of the cavity is in the range of 30 microns to 500 microns.

Example 14

The semiconductor device package structure of example 1 or any other example, wherein a diameter of the cavity is substantially constant along a length of the cavity.

Example 15

The semiconductor device package structure of example 1 or any other example, wherein: the substrate has a first surface, and a second surface opposite the first surface; the cavity extends from the first surface to the second surface; a diameter of the cavity monotonically varies along a length of the cavity, such that a diameter of the cavity at the first surface of the substrate is more than a diameter of the cavity at the second surface of the substrate.

Example 16

The semiconductor device package structure of example 1 or any other example, wherein: the phase change material is at a solid phase below the phase change temperature; the phase change material is at a liquid phase above the phase change temperature; and the phase change temperature is higher than 40 degree centigrade.

Example 17

A system comprising: a substrate having a cavity; a die coupled to the substrate; a power supply to supply power to the die; phase change material within the cavity, the phase change material having a phase change temperature lower than 200 degrees centigrade; first one or more interconnect structures to couple the die to the phase change material within the cavity; and second one or more interconnect structures to couple the phase change material within the cavity to a circuit board to which the substrate is attached.

Example 18

The system of example 17 or any other example, wherein: the die includes at least one of: a memory to store instructions, or a processor to execute the instructions; the first and second one or more interconnect structures are electrically floating; and the system comprises: third one or more interconnect structures to electrically couple the die to the substrate, and fourth one or more interconnect structures to electrically couple the substrate to the circuit board.

Example 19

A method comprising: receiving a substrate; forming a cavity within the substrate; depositing material having phase change properties within the cavity, the material having a phase change temperature less than 120 degrees centigrade; forming an interconnect structure that is coupled to the material; and coupling a die to the substrate, such that the die is coupled to the material by the interconnect structure.

Example 20

The method of example 19 or any other example, wherein forming the cavity within the substrate comprises: drilling the cavity using one of laser or a mechanical drill.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A semiconductor device package structure comprising:
a substrate having a cavity;
phase change material within the cavity, the phase change material having a phase change temperature lower than 120 degrees centigrade;
a die coupled to the substrate; and
one or more interconnect structures to couple the die to the phase change material within the cavity.

2. The semiconductor device package structure of claim 1, wherein the one or more interconnect structures are electrically floating.

3. The semiconductor device package structure of claim 1, wherein the one or more interconnect structures are first one or more interconnect structures, and wherein the semiconductor device package structure comprises:
second one or more interconnect structures to electrically couple the die to the substrate.

4. The semiconductor device package structure of claim 3, wherein the first one or more interconnect structures and the second one or more interconnect structures comprises electrically conductive material.

5. The semiconductor device package structure of claim 1, wherein:
the substrate has a first surface facing the die, and a second surface opposite the first surface; and the cavity extends from the first surface to the second surface.

6. The semiconductor device package structure of claim 1, wherein:
the substrate has a first surface facing the die, and a second surface opposite the first surface;
the substrate includes one or more core layers and one or more layers comprising dielectric material;
the cavity extends from the first surface to the second surface, and traverses through the one or more core layers and the one or more layers comprising dielectric material; and
the semiconductor device package structure comprises another one or more interconnect structures coupled to the second surface of the substrate, the another one or more interconnect structures to couple the semiconductor device package structure to a circuit board.

7. The semiconductor device package structure of claim 1, wherein:
the phase change material comprises one or more of: paraffin, metal hydride, or salt hydride.

8. The semiconductor device package structure of claim 1, wherein the cavity has:
a first end coupled to the die by the one or more interconnect structures; and
a second end affixed to a layer comprising electrically conductive material.

9. The semiconductor device package structure of claim 1, wherein:
the die has a first surface facing the substrate, and a second surface opposite the first surface;
the first surface of the die is coupled to the substrate and to the phase change material; and
the semiconductor device package structure comprises a heat spreader coupled to the second surface of the die.

10. The semiconductor device package structure of claim 1, wherein the die is a first die, and the semiconductor device package structure comprises:
a second die, wherein the first and second dies are in a stack over the substrate, with the first die between the substrate and the second die, wherein the phase change material is first phase change material; and
a second phase change material between the first die and the second die.

11. The semiconductor device package structure of claim 10, wherein:
a first surface of the second die faces the first die, and a second surface of the second die is opposite the first surface; and
the semiconductor device package structure comprises a heat spreader coupled to the second surface of the second die.

12. The semiconductor device package structure of claim 1, wherein one or more interconnect structures are to thermally couple the die to the Phase Change Material within the cavity.

13. The semiconductor device package structure of claim 1, wherein a width of the cavity is in the range of 30 microns to 500 microns.

14. The semiconductor device package structure of claim 1, wherein a diameter of the cavity is substantially constant along a length of the cavity.

15. The semiconductor device package structure of claim 1, wherein:
the substrate has a first surface, and a second surface opposite the first surface;
the cavity extends from the first surface to the second surface;
a diameter of the cavity monotonically varies along a length of the cavity, such that a diameter of the cavity at the first surface of the substrate is more than a diameter of the cavity at the second surface of the substrate.

16. The semiconductor device package structure of claim 1, wherein:
the phase change material is at a solid phase below the phase change temperature;
the phase change material is at a liquid phase above the phase change temperature; and
the phase change temperature is higher than 40 degree centigrade.

17. A system comprising:
a substrate having a cavity;
a die coupled to the substrate;
a power supply to supply power to the die;
phase change material within the cavity, the phase change material having a phase change temperature lower than 200 degrees centigrade;
first one or more interconnect structures to couple the die to the phase change material within the cavity; and
second one or more interconnect structures to couple the phase change material within the cavity to a circuit board to which the substrate is attached.

18. The system of claim 17, wherein:
the die includes at least one of: a memory to store instructions, or a processor to execute the instructions;
the first and second one or more interconnect structures are electrically floating; and
the system comprises:
third one or more interconnect structures to electrically couple the die to the substrate, and
fourth one or more interconnect structures to electrically couple the substrate to the circuit board.

19. A method comprising:
receiving a substrate;
forming a cavity within the substrate;
depositing material having phase change properties within the cavity, the material having a phase change temperature less than 120 degrees centigrade;
forming an interconnect structure that is coupled to the material; and
coupling a die to the substrate, such that the die is coupled to the material by the interconnect structure.

20. The method of claim 19, wherein forming the cavity within the substrate comprises:
drilling the cavity using one of laser or a mechanical drill.

* * * * *